Nov. 18, 1969 P. PLESHKO 3,479,523

INTEGRATED NOR LOGIC CIRCUIT

Filed Sept. 26, 1966

*INVENTOR.*
PETER PLESHKO
*BY* Charles P. Boberg
ATTORNEY

United States Patent Office 3,479,523
Patented Nov. 18, 1969

3,479,523

INTEGRATED NOR LOGIC CIRCUIT

Peter Pleshko, Waldwick, N.J., assignor to International Business Machines Corporation, Armonk, N.Y., a corporation of New York Filed Sept. 26, 1966, Ser. No. 581,997
Int. Cl. H03k *19/08*
U.S. Cl. 307—205 1 Claim

ABSTRACT OF THE DISCLOSURE

A field effect transistor NOR logic circuit including a high resistance load resistor, one or more logic input elements which can be controlled to inhibit an output signal, a transistor connected in parallel with said load resistor to allow a fast transistion in the output signal when the output is being sensed, and another transistor which is connected in parallel with said logic input elements to inhibit the output signal whenever the output is not being sensed.

This invention relates generally to logic circuits employing transistors, and it relates particularly to integrated logic circuitry.

Logic circuits such as AND, OR and NOR circuits using conventional bipolar transistors are well known. Such circuits can be operated at high speeds with low power consumption. When bipolar transistors are utilized in integrated logic circuitry, however, difficulties may be encountered in the fabrication of such apparatus. Bipolar transistor devices are not inherently self-isolating and therefore may require special isolating means between adjacent devices, and the operating characteristics of such elements cannot be determined merely by the physical proportioning of the transistor structure. These factors tend to complicate the design of transistor circuitry using bipolar components.

The newer field effect transistors (FET's) have the advantage that they are self-isolating and they can be proportioned in much the same manner as resistors to provide the desired operating characteristics. These properties tend to make FET's attractive for use in integrated circuitry. It has been commonly assumed, however, that FET's must consume much higher average power than bipolar transistors in order to attain the same switching speeds, and this assumption has detracted considerably from the desirability of FET's as integrated circuit components.

A general object of the present invention is to increase the utility of field effect transistors by enabling them to operate at high switching speeds with low average power consumption.

A more specific object is to adapt logic circuitry for the utilization of simple, readily integratable FET circuit configurations without sacrificing the advantages of high speed and low power that heretofore could be realized only by using bipolar transistors.

In accordance with the invention, a logic circuit is composed of FET elements which are arranged to draw current through a common load resistor that has a high resistance for limiting the standby power supplied to these elements. When the state of the logic circuit is to be read, the load resistor momentarily is shunted by another FET which functions as a switch in response to a clock pulse. If at that instant the capacitive impedance coupled to the output terminal is in the process of becoming charged through the aforesaid load resistance (which normally limits the charging rate), the shunting of this resistance by the switch transistor now greatly expedites the charging rate, so that the output terminal quickly attains its limiting potential due to the higher current flowing during this clock pulse period. This novel type of circuit arrangement keeps the average power consumption very low; yet the logical state of the circuit can be sensed very quickly.

The foregoing and other objects, features and advantages of the invention will be apparent from the following more particular description of a preferred embodiment of the invention, as illustrated in the accompanying drawings, wherein.

Figure 1:
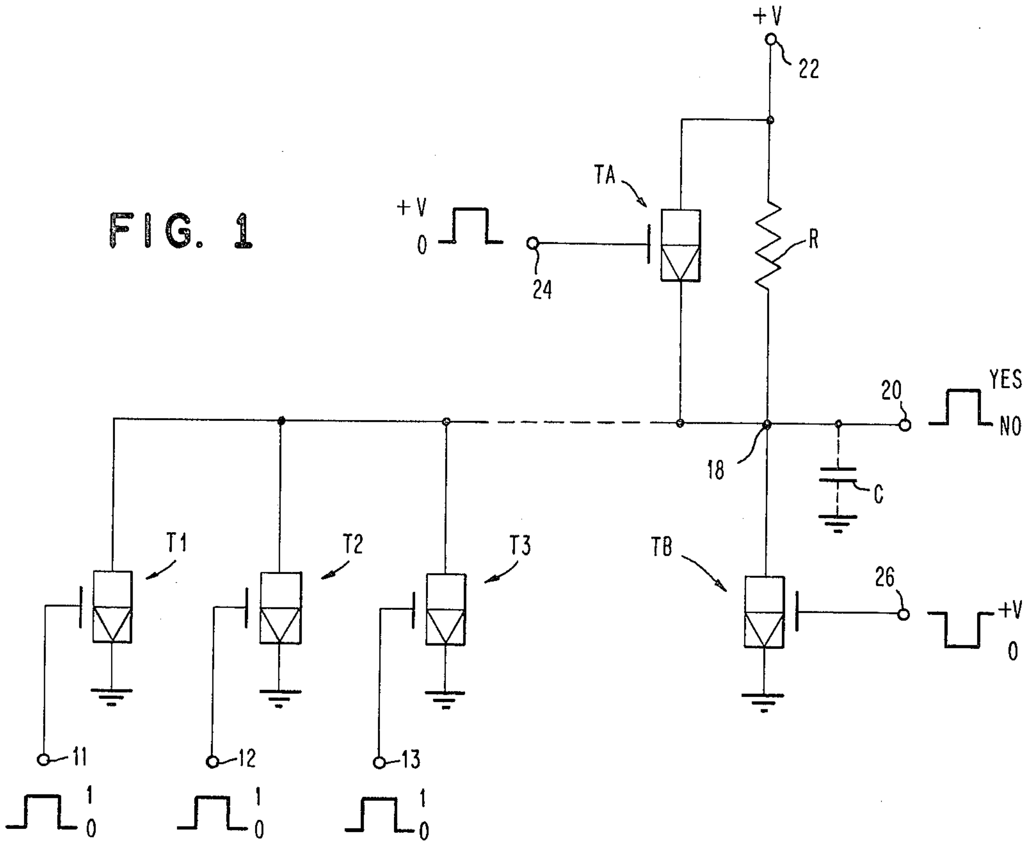
FIG. 1 is a circuit diagram of an exemplary NOR logic unit embodying the invention.
Figure 2:
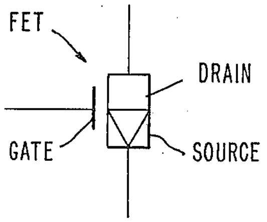
FIG. 2 is a legend explaining the field effect transistor symbols that are used in FIG. 1.

In FIG. 1 there is shown a circuit diagram of a representative logic unit (in this instance a NOR circuit) which embodies the principle of the invention. The active logic elements are field effect transistors (FET's) such as T1, T2 and T3, the respective gate electrodes of which are connected to corresponding input terminals such as 11, 12 and 13. As many of these input terminals and associated FET's are provided as there are logical inputs to the unit. The input terminals 11, 12, 13, and so forth, normally are maintained at a reference potential indicative of zero, which for convenience is assumed herein to be at ground potential. The source electrodes of the transistors T1, T2, T3, and so forth, are grounded, and the drain electrodes of these transistors are connected in parallel to a common point or junction 18, which is electrically connected to an output terminal 20.

The high-voltage terminal 22 of the direct-current voltage supply (not shown) is connected through a common load resistor R to the junction 18, which, as just mentioned, is connected to the output terminal 20 and to the drain electrodes of transistors T1, T2 and T3. Normally these transistors draw their currents through the resistor R, which (in accordance with the novel teachings of the present invention) has a sufficiently high resistance so that the standby power consumed by transistors T1, T2 and T3 between successive reading or sensing operations is quite low. The low-voltage side of the voltage supply is assumed to be at ground potential. If the gate of any one of the transistors T1, T2, T3, etc., is sufficiently positive to maintain this transistor in a state of high conductivity, then the drain of that transistor is effectively grounded, thereby keeping the potential of the output terminal 20 at or close to the ground level.

A "NOR" state exists when all the inputs to the logic unit are ZEROS, that is, when none of these inputs is a ONE. It is assumed herein, for illustrative purposes, that a positive voltage applied to any one of the input terminals such as 11, 12 or 13 represents a binary ONE input at that terminal. The application of a ONE input to any one of these terminals, therefore, is sufficient to produce a zero or ground potential at the output terminal 20. This signifies that the "NOR" condition has not been fulfilled. However, if no ONES are present at any of the input terminals, then the transistors T1, T2 and T3 become nonconductive (or substantially so), and assuming that there is no other conductive path between point 18 and ground, the potential of output terminal 20 then rises toward the high voltage level (+V) of the power supply terminal 22. The appearance of this positive output voltage on terminal 20 signifies the existence of the NOR state (i.e., a complete absence of ONE inputs).

The use of a load resistor R having a high resistance is advantageous in that it limits the standby power consumed by the transistors T1, T2, etc. However, if all of the transistors connected in parallel between the output terminal 20 and ground are turned off (that is, rendered nonconductive), the presence of a high resistance between the voltage supply terminal 22 and the output terminal 20, together with the unavoidable presence of stray capacitance between the output terminal 20 and ground (as represented symbolically in FIG. 1 by the lumped capacitance C), tend to delay the recovery of full potential on the terminal 20. A part of the stray capacitance C is made up of the individual capacitances between the respective drain and gate electrodes of the various FET's connected between junction 18 and ground. When the last of the logic elements T1, T2, T3, etc., has been turned off, the capacitor C starts to charge. If charging current were drawn only through the high resistance R, then the voltage across C would rise rather slowly. In the worst case, this could delay the recovery of full output potential sufficiently to prevent the sensing of a NOR state, unless there is a sufficient increase of operating power to prevent such a delay. In accordance with the present teachings, the recovery time is rendered negligible without requiring a large average power expenditure, this being accomplished in the following manner:

A switching transistor TA, preferably of the field effect type, is arranged so that it shunts the load resistor R in response to a positive clock pulse. Such a pulse is applied to the gate terminal 24 of transistor TA during each reading or sensing period. If at the instant when transistor TA becomes conductive, the logic unit then is in the process of changing from its "not NOR" (or "NO") state to its "NOR" (or "YES") state, meaning that the stray capacitance C is then being charged to its limiting positive potential through the resistor R, the shunting of resistor R by transistor TA now accelerates this charging process and thereby brings the potential of output terminal 20 quickly to its upper limit. On the other hand, if any one of the transistors T1, T2, etc., is still in its conductive state at this time, the output potential at terminal 20 will be held at or near ground level, notwithstanding the fact that the resistor R is being shunted by transistor TA.

In order to limit the time interval during which the output voltage of the device is permitted to remain at its upper value indicative of a NOR state, a field effect transistor TB is connected between the output terminal 20 and ground, and its gate electrode is connected to a terminal 26 that normally is maintained at a positive potential but which is brought to ground potential by a negative-going clock pulse during the reading period. The negative-going clock pulse coincides in time with the positive-going clock pulse applied to terminal 24. The transistor TB behaves functionally as one of the logic elements T1, T2, etc. At all times except during the reading interval, when it becomes nonconductive, the transistor TB maintains ground potential on the output terminal 20. The use of transistor TB is optional. If it is not necessary to have an output pulse which is limited in width to the duration of the clock pulse, TB then can be omitted. In this case, if all of the logic elements T1, T2, etc., are off (i.e., in their ZERO states), then a positive output voltage is maintained on the terminal 20 until the first time that a logic element is turned on again.

Summarizing the operation of the above-described NOR circuit, the field effect transistor TA is the active element of a source follower circuit wherein the source-to-ground resistance comprises the parallel-connected resistances of the various logic elements T1, T2, T3 . . . TB (transistor TB functioning as a normally conductive logic element with regularly recurring "off" periods). During periods when TA is shut off (i.e., between reading intervals) the logic elements draw their drain currents through the high-resistance path R, thereby limiting the standby power consumed by these elements to a very low value. When the logical state of the device is to be read, TA is briefly turned on by a clock pulse (TB being simultaneously turned off at the same time), causing resistor R to be shunted by the low resistance of transistor TA when the same is in its conductive state. If all of the logic elements T1, T2, etc., are in their "off" or ZERO states at this time, indicating fulfillment of the NOR condition, the shunting of R by TA insures that a positive output potential, or "yes" indication, will be manifested at the common output terminal 20 of the field-effect transistors T1, T2 and T3 at the very beginning of the read interval, so that it is not necessary to delay the sensing of the NOR state. Otherwise, the stray capacitance C would have to be charged through the high resistance R, possibly causing a false "no" indication to appear at the output terminal 20 at the beginning of the read period if this capacitance were not then fully charged to its upper potential limit. If the NOR state does not actually exist (meaning that one of the transistors T1, T2, T3, etc., is still conducting when TA is turned on), the conducting logic element serves as a ground clamp to prevent a rise in the output voltage.

The switching transistor TA is not required to have a sharply defined disturbance threshold, since it does not perform a logical function. The integration of this transistor with the other elements of the circuitry does not present a difficult problem.

While the particular logic circuit illustrated herein for descriptive purposes is a NOR circuit, the present teachings obviously are applicable to other types of logic circuitry such as NAND and flip-flop circuits, for example, the distinctions between these circuits being semantic, depending upon the particular meanings that are attributed to their respective inputs and outputs, or requiring interconnection of several basic blocks.

The term "field effect transistor" or FET is intended to be synonymous with, or to include, for practical purposes, the metal-oxide-semiconductor transistor or MOST, as it commonly is known. The expressions "input terminal" and "output terminal " are used herein for convenience to designate the input and output sides of a particular stage in the logic circuitry, there being many such stages in practice. Likewise, the designation of the transistor electrodes as "drains" or "sources" is purely relative, it being well known that these are functional terms which are assigned according to the polarities of the applied voltages.

While the invention has been particularly shown and described with reference to a preferred embodiment thereof, it will be understood by those skilled in the art that various changs in form and details may be made therein without departing from the spirit and scope of the invention.

What is claimed is:

1. A logic circuit operable from a voltage supply to furnish an output voltage indicating the state of a plurality of input voltages, said circuit comprising:

a plurality of input terminals for receiving the respective input voltages;

an output terminal at which the output voltage is manifested;

a plurality of logic elements respectively arranged to establish a plurality of variable-conductance current paths extending in parallel from one side of the voltage supply to a point electrically connected to said output terminal, each of said logic elements including a field effect transistor having a gate electrode connected to a respective one of said input terminals and having source and drain electrodes arranged in a respective one of said current paths for causing the conductance thereof to vary according to the respective input voltage;

conductive means including a resistor for connecting the other side of the voltage supply to said output point, said resistor having a relatively high resistance and normally being effective to limit any current drawn from the voltage supply by said logic elements;

a field effect transistor connected so as to establish a conductive path which at least partially shunts said resistor and having a gate electrode to which a timing pulse may be applied for rendering the last mentioned field effect transistor conductive during the presence of said timing pulse;

an additional field effect transistor arranged in parallel with said logic elements, and means for maintaining said additional field effect transistor in a conductive state at all times except during the period of said timing pulse.

References Cited

UNITED STATES PATENTS

| | | | |
|---|---|---|---|
| 3,292,008 | 12/1966 | Rapp | 307—251 X |
| 3,406,298 | 10/1968 | Axelrod | 307—215 X |

DONALD D. FORRER, Primary Examiner

U.S. Cl. X.R.

307—215, 251, 304